United States Patent [19]
Barton

[11] 3,977,002
[45] Aug. 24, 1976

[54] TRACKING FILTER FOR FREQUENCY IN A DOPPLER TYPE NAVIGATION GUIDANCE SYSTEM OR THE LIKE

[75] Inventor: Paul Barton, Bishops Stortford, England

[73] Assignee: International Standard Electric Corporation, New York, N.Y.

[22] Filed: Feb. 6, 1975

[21] Appl. No.: 547,598

[30] Foreign Application Priority Data
Feb. 12, 1974 United Kingdom.................. 6280/74

[52] U.S. Cl. .......................... 343/106 D; 324/79 R; 331/9; 343/108 M
[51] Int. Cl.² ............................................ G01S 1/40
[58] Field of Search .................. 343/106 D, 108 M; 324/79 R, 78 N; 331/9

[56] References Cited
UNITED STATES PATENTS
3,866,227  2/1975  Ruvin.............................. 343/106 D
3,893,118  7/1975  Overbury........................ 343/106 D Primary Examiner—Maynard R. Wilbur
Assistant Examiner—Richard E. Berger
Attorney, Agent, or Firm—William T. O'Neil

[57] ABSTRACT

A Doppler type radio navigation system in which each element of a linear array is energized discretely and sequentially to produce a simulated Doppler effect at a remote location such as an aircraft on landing approach. A reference signal is also transmitted, and a receiver at the remote location "sees" a Doppler frequency shift proportional to the sine of the angle subtended by the receiver normal to the axis of the array by processing of the commutated data against the received reference signal to obtain a beat. A sum and difference transversal tracking filter arrangement is included for tracking the desired beat signal to exclude multi-path spurious beat signals. The tracking arrangement includes a voltage controlled oscillator, the detected beat signal being taken therefrom. Low noise bandwidth is obtained and performance under severe multipath conditions is improved.

4 Claims, 30 Drawing Figures

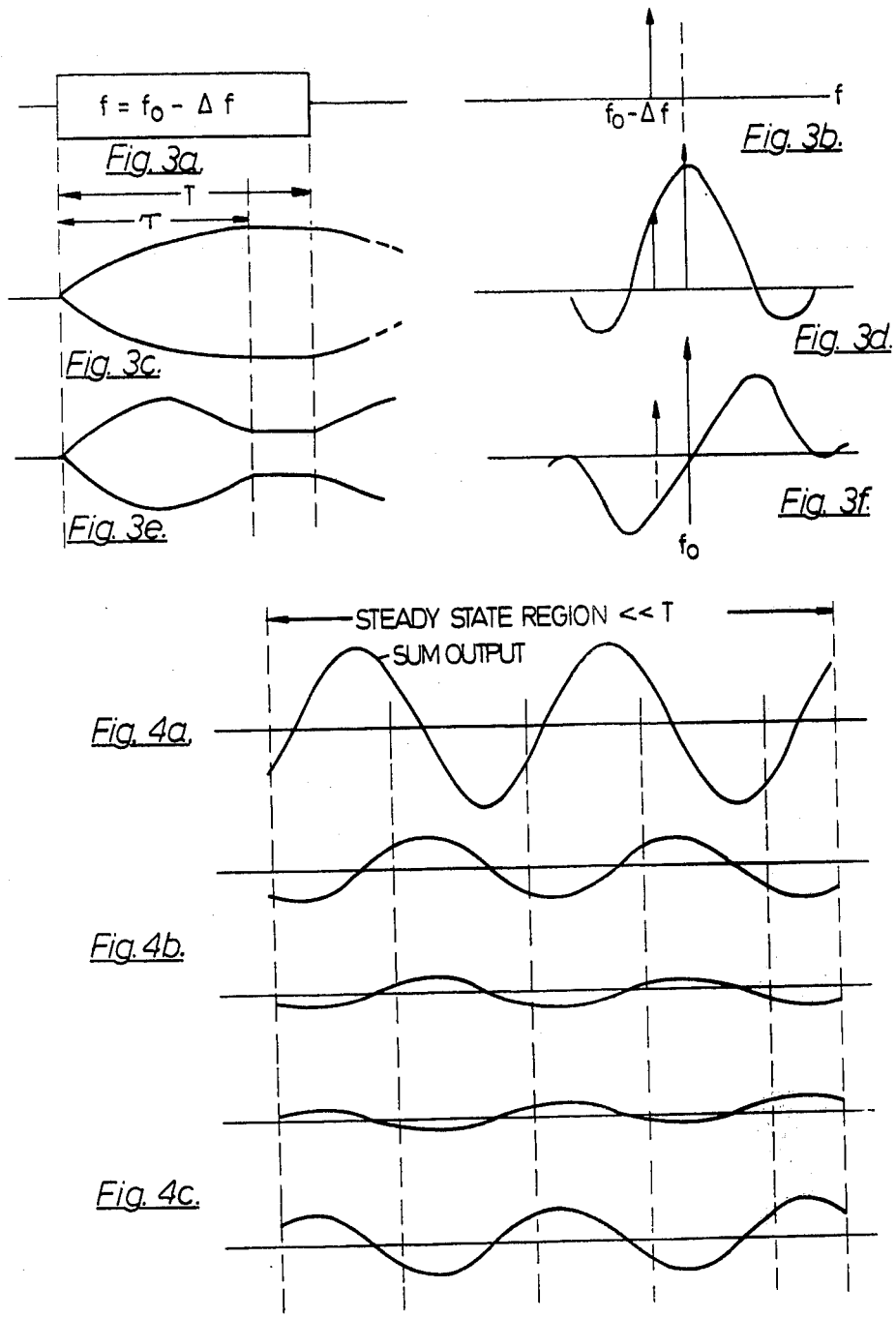

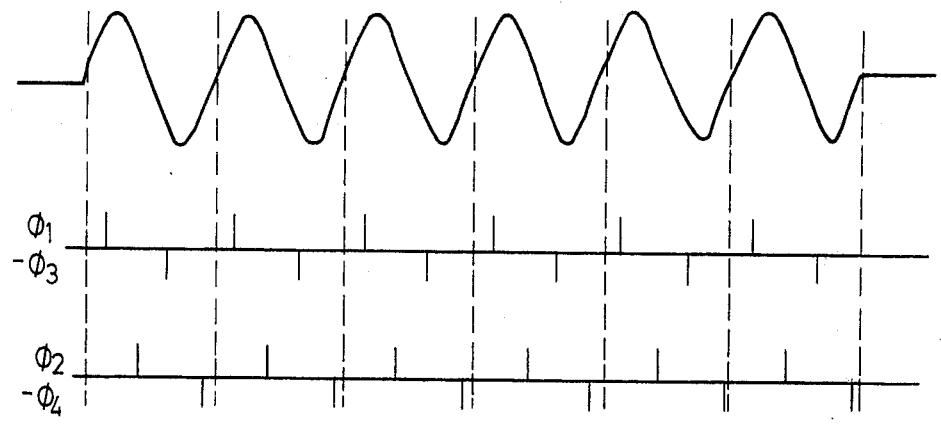
Fig. 10.
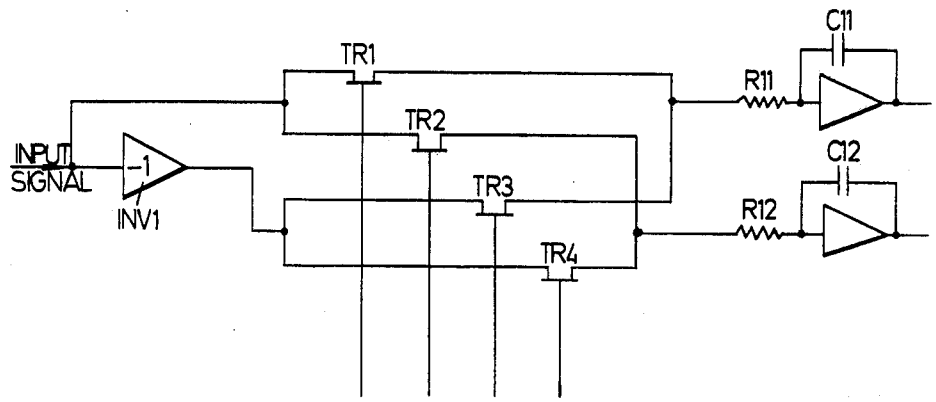
Fig. 11.
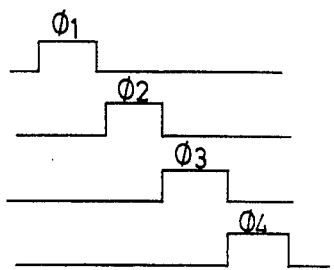

TRACKING FILTER FOR FREQUENCY MEASUREMENT IN A DOPPLER TYPE NAVIGATION GUIDANCE SYSTEM OR THE LIKE

BACKGROUND OF THE INVENTION

1. Field of the Invention

The invention relates generally to frequency measuring apparatus operative in the presence of spurious frequency components, and more particularly to measurement of frequency coded angle data as in a Doppler Navigation system or the like.

2. Description of the Prior Art

The so-called Doppler Navigation system (Doppler ILS) is known per se, and is variously described in patents and other technical literature. For example, basic forms of radio beacons which provide the typical commutated array signal transmission format are described in U.S. Pat. Nos. 3,626,419 and 3,670,337.

In a Doppler radio navigation system (sometimes called Doppler ILS) in connection with which the embodiments are to be described, there is an established beacon signal transmission format involving commutation of a first radio frequency in turn to each of a plurality of linear array antenna elements so as to simulate a constant velocity scanning of the array (with a scan time of T), whereby a main-bearing signal is transmitted which, as "seen" by a remote receiving station of the system, undergoes a Doppler frequency shift proportional to the sine of the angle subtended by the receiver normal to the axis of the array. Also included is simultaneous transmission of a reference signal of a second radio frequency (offset from the first) against which the receiver is able to derive a Doppler beat waveform from the said main-bearing signal, the beat having a frequency indicative of the angle of the said remote receiving station.

One of the most serious problems arising in such systems as the aforementioned is the problem of multipath signals. The remote receiving station ideally would receive only a direct path signal, but in the practical situation spurious signals are also extant at the receiver as a result of reflections from nearby object (including the ground).

The manner in which the present invention deals with this and other prior art problems will be understood as this description proceeds.

SUMMARY OF THE INVENTION

According to the invention there is provided a frequency measuring arrangement including a device for sampling an input signal waveform, a circuit for deriving from the samples a pattern of sum and difference signals indicative of the relationship between the frequency of the input signal and the sampling frequency, a circuit responsive to the sum and difference signals to control a variable frequency generator in such a manner as to cause the input signal frequency and the sampling frequency to be brought into a predetermined relationship with each other, and a device for determining the frequency of said generator as an indication of the frequency of said input signal.

The invention will be best understood from the following description taken in conjunction with the accompanying drawings, relating to preferred embodiments of the frequency measuring arrangement applied to the measuring, and tracking of a Doppler beat frequency signal as derived in an aircraft (remote station) radio receiver in a Doppler radio navigation system where the Doppler signal frequency indicates the aircraft azimuth or elevation angle on an ILS approach and landing.

BRIEF DESCRIPTION OF THE DRAWINGS

FIGS. 2 through 5 depict various waveforms extant, under conditions to be described, in the circuit of FIG. 1.

FIG. 10 is a two channel timing/phase diagram relating to input signal waveform sampling.

FIG. 11 is a circuit for accomplishing the four phase sampling on two channels in accordance with FIG. 10.

DESCRIPTION OF THE PREFERRED EMBODIMENTS

Figure 1:
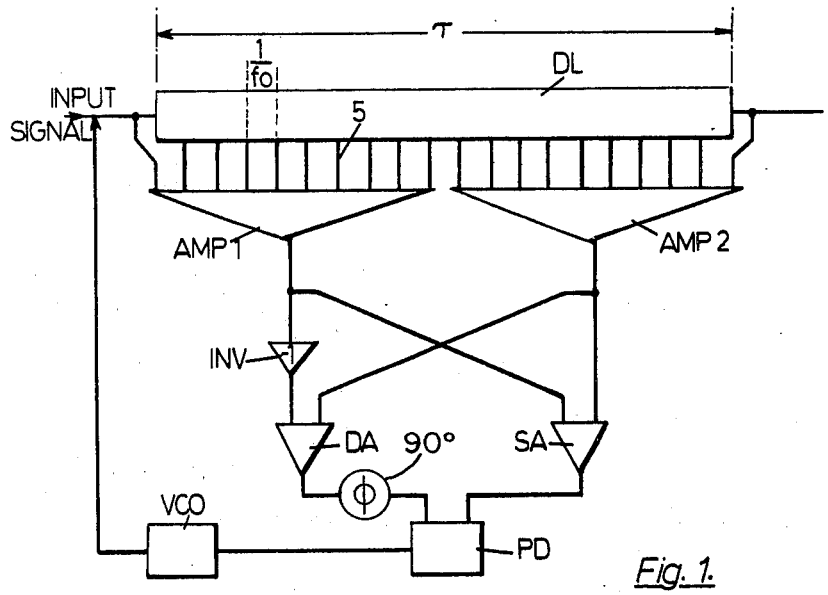
FIG. 1 is a block diagram of an analog form of a portion of the remote station instrumentation according to the invention.

Referring now to FIG. 1, the input (beat) signal (from each scan of the Doppler array) of frequency $f$, is passed into a delay line DL, the total delay time ($\tau$) of the delay line DL corresponding very nearly to the scan time (T). Equi-spaced taps 5 (interval $1/f_o$ provide means of frequency selectivity, with the first half and the second half of the taps being connected to respective amplifiers AMP1 and AMP2, and thence to a sum amplifier SA, and via an inverter INV for the first half, to a difference amplifier DA. The simplest example is that of adding the tap signals together with constant weighting, yielding a steady state frequency response of the form $$(e^{jx}) \frac{\sin nx}{n \sin x} = (e^{jx}) \frac{\sin nx}{nx}$$

(centered around $f_o$), where $x = \pi f/f_o$ and $n = Tf_o$

By subtracting the summed output of the first half of the delay line from the second half, a difference pattern of the form (around $f_o$) described according to $$e^{j(Kx+\pi/2)} \frac{\sin^2\frac{nx}{2}}{n\sin\frac{x}{2}} = e^{j(Kx+\pi/2)} \frac{\sin^2\frac{nx}{2}}{\frac{nx}{2}}$$

is obtained.

Figure 2A:
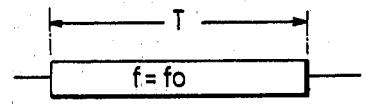
Figure 2B:
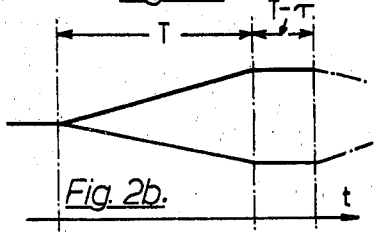
Figure 2C:
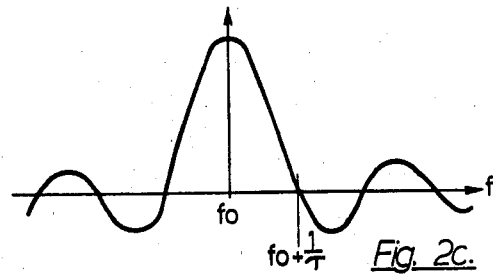
Figure 2D:
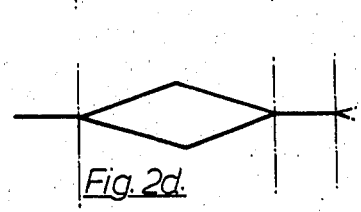
Figure 2E:
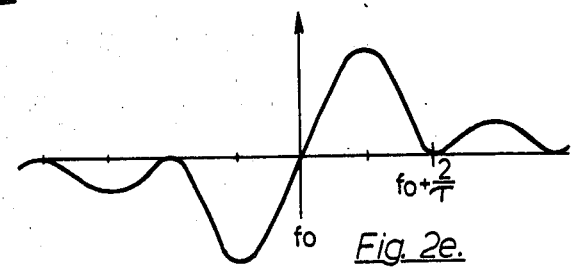

Use as a filter in the frequency range $f_o/2$ to $3/2f_o$ avoids ambiguous maxima of the frequency response at points other than $f_o$. With an input signal at $f = f_o$, of duration T (FIG. 2(a)) representing the input signal envelope) the steady state outputs are a maximum at $f_o$ for the sum signal. FIGS. 2(b) and 2(c) show respectively, the transient response of the sum output over time T followed by the steady state output over time $T-\tau$, and the steady state amplitude response of the sum output, and zero output at $f_o$ for the difference signal (FIG. 2(c)). FIGS. 2(d) and 2(e) show, respectively, the transient response of the difference output followed by the steady state output, and the steady state amplitude response of the difference output (in quadrature with the sum output).

A signal frequency slightly greater or less than $f_o$ e.g. at $f = f_o - \Delta f$, (see FIGS. 3(a) and 3(b)) produces little change in the sum response, FIG. 3(c), (i.e., in the amplitude of the sum signal, FIG. 3(d), but yields a response from the difference output, FIG. 3(e) which increases with the amount by which the frequency is "off-tune", FIG. 3(f). The response during the steady state region, when the signal frequency is greater than $f_o$ is in leading quadrature, FIG. 4(c), with respect to the sum output, FIG. 4(a). If the signal frequency is less than $f_o$, then this response is in lagging quadrature, FIG. 4(b).

By phase shifting the output of the difference amplifier DA by 90° in $\phi$(FIG. 1) and applying it together with the output of the sum amplifier SA to a product detector PD (FIG. 1) an error signal is produced which is either negative or positive depending on whether the signal applied to the filter is low or high in frequency. This provides the means for controlling a voltage controlled oscillator VCO in an unambiguous manner (over a restricted frequency range) to adjust the effective signal frequency (from this oscillator) applied to the delay line DL to $f_o$.

The duration of the steady state region must necessarily exceed the half period of $f_o$, so that a valid signal is produced from the product detector PD.

Figure 5:
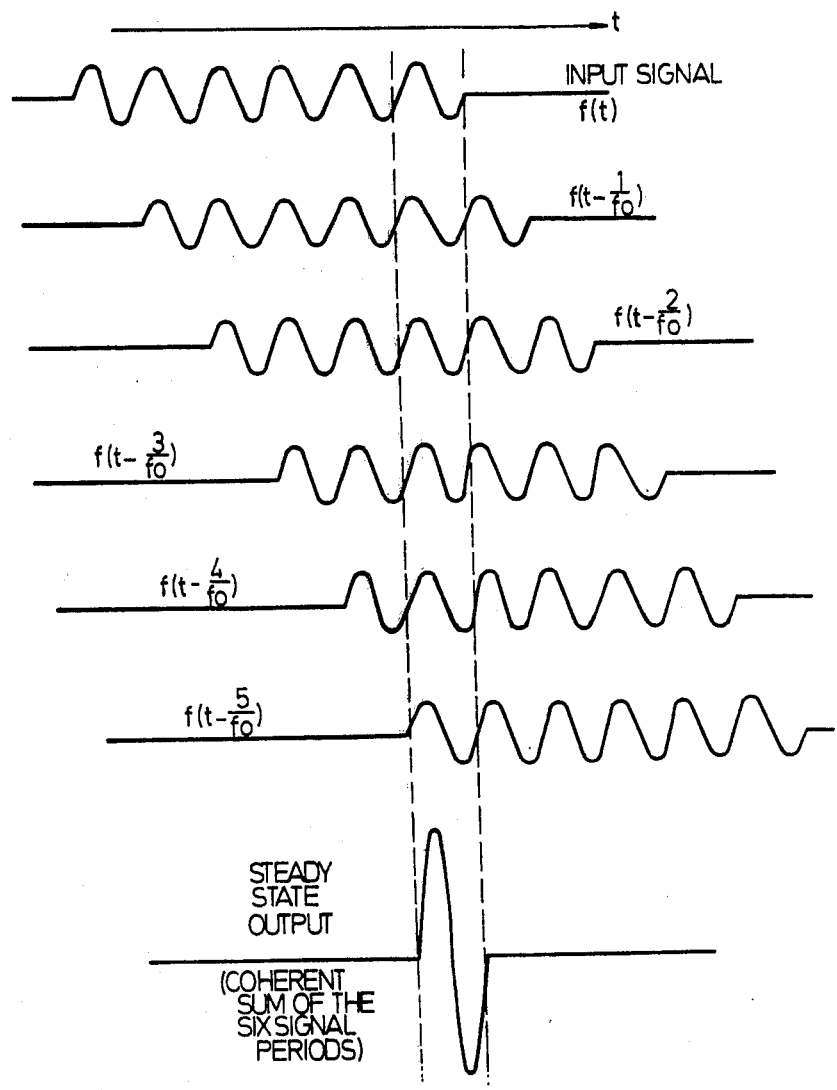

No further advantage may be gained from integration of the product detector output (which could be achieved by appreciably shortening $\tau$) since a maximum coherent integration of the signal in the delay line is obtained by making the delay line as long as possible (i.e. $\tau \to T$), FIG. 5. What is gained by post-filter integration is lost by necessarily widening the bandwidth of the filter.

Thus, for example, the steady state region is chosen to be equal to one period of $f_o$ which is $1/f_o$ seconds. If n cycles of signal are contained in the scan, then the delay of the line $\tau$ is related to scan time T by $$\tau = \frac{n-1}{n}T$$

The nature of the steady state signals to be formed by the delay line filter will now be examined.

Figure 6:
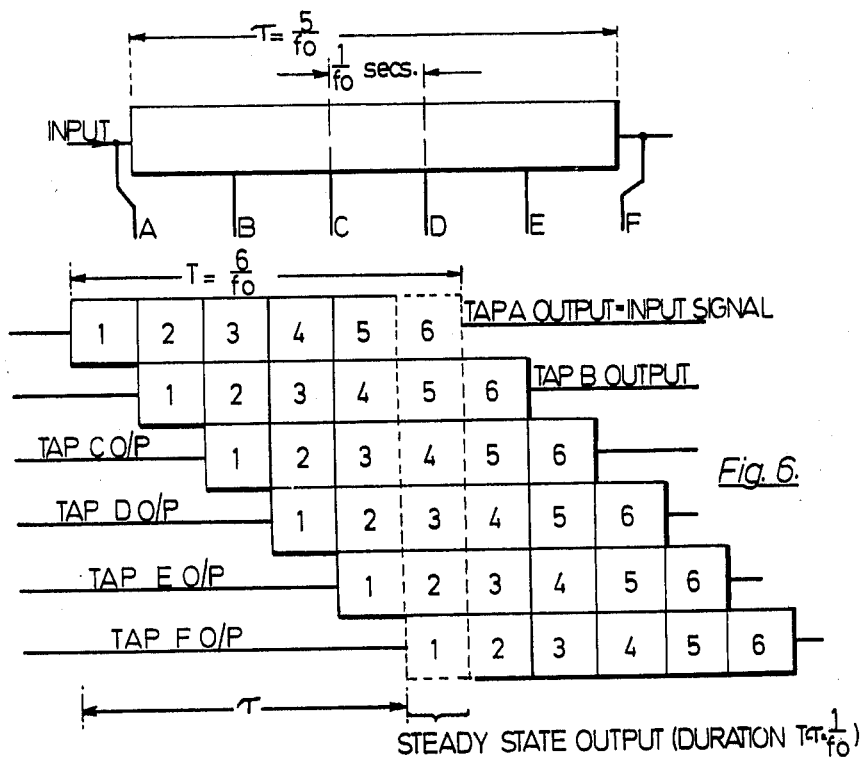
FIG. 6 depicts delay characteristics from tap to tap of the delay line of FIG. 1.

The example in FIG. 6 shows a delay line DL1 with six taps (A, B, C, etc.) spaced $1/f_o$ apart the line having a total delay of $\tau=5/f_o$. Subsequent taps yield an increasingly delayed version of the signal. The steady state of a circuit which combines signals from all taps occurs when the line is "filled" with signal. For a signal of duration T (where in this example $T=6/f_o$), the steady state response region occurs between $t=\tau=5/f_o$ and $t=T=6/f_o$. The signal representation in the figure assumes subdivision into six parts each of duration $1/f_o$, labelled 1, 2, 3, 4, 5, 6. The input signal is a sequence or row of parts, and the steady state response is the sum of a column of the same parts i.e., the steady state output, duration $(T-\tau)=1/f_o$, is the coherent sum of the six signal periods each of $1/f_o$ secs. duration.

Figure 7:
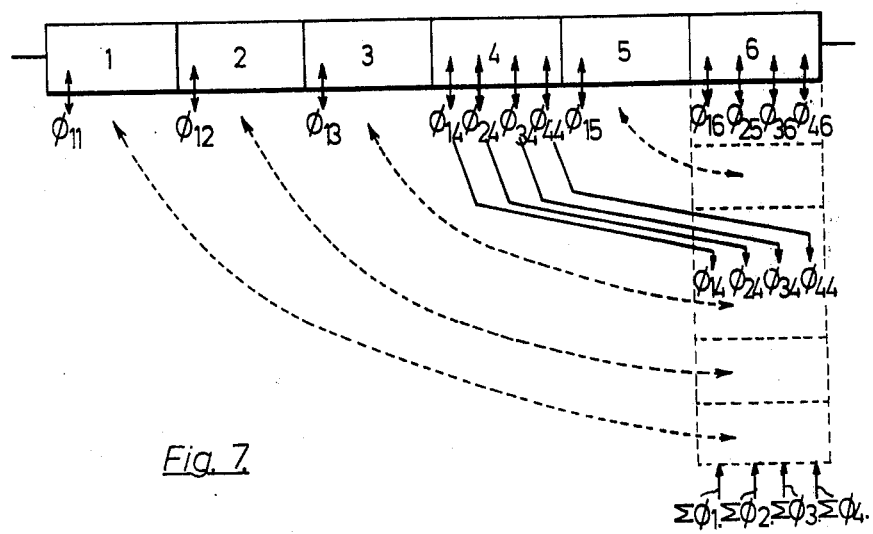
FIG. 7 illustrates a digital device for performing the delay line function of FIG. 1.

Let each designated part of the signal be divided into four smaller parts or phases (signal 1 divided into $\psi_{11}$ $\psi_{12}$ $\psi_{13}$ $\psi_{14}$ and so on). The steady state signal is now represented as four signal states, each being a column sum of like sub-parts (FIG. 7). That is, the first column $\Sigma\psi_1$ is summed to give the first 'quadrant' of the filter output, column 2 gives the second quadrant, and so on 1st column, $\Sigma \psi_1 = \psi_{11} + \psi_{21} + \psi_{31} + \psi_{41}$
2nd column, $\Sigma \psi_2 = \psi_{12} + \psi_{22} + \psi_{32} + \psi_{42}$
3rd column, $\Sigma \psi_3 = \psi_{13} + \psi_{23}$ etc.
4th column, $\Sigma \psi_4 = \psi_{14} + \psi_{24}$ etc.

Figure 8:
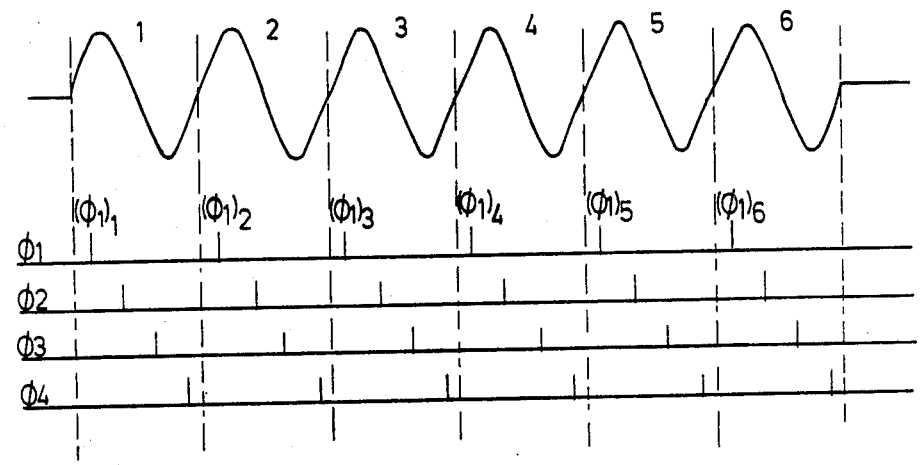
FIG. 8 is a timing/phase diagram relating to sampling of an input signal waveform.
Figure 9:
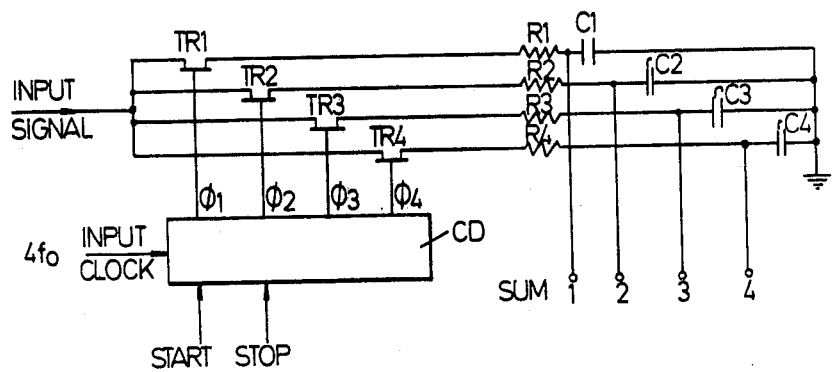
FIG. 9 is a circuit for accomplishing the four phase sampling in accordance with FIG. 8.

The sums can be formed by an alternative approach (FIG. 8). The sum equivalent to the first column is formed by sampling, $(\psi_1)_1 - (\psi_1)_6$ during the first quarter of each signal part and charging an initially uncharged capacitor (not shown) with a charge proportional to the strength of each signal sample. This is a known sampling technique. Likewise, the sums equivalent to columns 2, 3 and 4, are formed by sampling the signal parts in the various different phases, $(\psi_2)_1 - (\psi_2)_6$, $(\psi_3)_1 - (\psi_3)_6$ and $(\psi_4)_1 - (\psi_4)_6$, similarly with capacitors each discretely associated with a different phase. At the end of the scan, the capacitors are charged with voltages equivalent to the sampled steady state signals from the original tapped delay line. FIG. 9 shows the circuit schematic for this simplified approach. The input signal is sampled in successive quadrants by the appropriate control of four switches (typically field effect transistors), TR1 to TR4, each gated on in turn by a four phase clock divider CD fed with input clock pulses at a frequency $4f_o$, the sampling being started at the beginning of each scan and stopped at the end of the signal scan. The $\psi_1$ samples successively charge a capacitor C1, and the $\psi_2$, $\psi_3$ and $\psi_4$ samples successively charge respective capacitors C2, C3 and C4, via resistances R1, R2, R3 and R4. At the end of each scan, output (sum) signals are available which are processed as described later. Constant current charging of the capacitors is achieved by making the RC product much larger than the scan time. This will result in fairly low signals to be detected on the capacitors (e.g. RC =100T, peak capacitor voltage ~50 mV if the signal level is 5 volts). For some applications a more ideal integrator could be used.

The width of the sampling pulses need not be as small as relatively indicated in FIG. 7. The analog signal may be 'gated' into the charging circuit associated with each phase for the entire quarter period.

It is not essential to use four capacitors for registering the steady state response of the filter. Refer first to the equivalent tapped delay line: a tap spacing of $1/2f_o$ with alternate taps given the opposite polarity of weighting will give a maximum response at $f_o$, $3f_o$, $5f_o$ etc., with utilization of the $f_o$ maxima, as before. This is instrumented in simple digital filter form by sampling at four times the signal frequency, as before, but with the contribution from the third quadrant inverted by inverter INV 1 and added to the contribution from the first quadrant (FIGS. 10 and 11). Similarly, the fourth quadrant contribution is inverted and added to that from the second quadrant. Thus, the information from all four phases of signal sampling is preserved, but is transmitted in only two channels, and therefore only two capacitors (charging circuits R11 C11 and R12 C12) are needed to store the information. In the circuit of FIG. 11(a) an alternative charging circuit is shown incorporating an amplifier, which gives greater linearity. FIG. 11(b) shows the gating (sampling control) signals $\phi 1$ through $\phi 4$, corresponding respectively, to TR1 through TR4.

Derivation of an error signal for tracking the signal frequency requires that the product of the sum signal and the phase-shifted (90°) difference signal be produced.

Two samples of each signal are available
Steady state Sum signal = $\Sigma_{13}, \Sigma_{24}$
Steady state Difference signal = $\Delta_{13}, \Delta_{24}$ An equivalent to phase shifting the difference signal by 90° before forming the product is to derive cross-products of the two signals, i.e.

Figure 12:
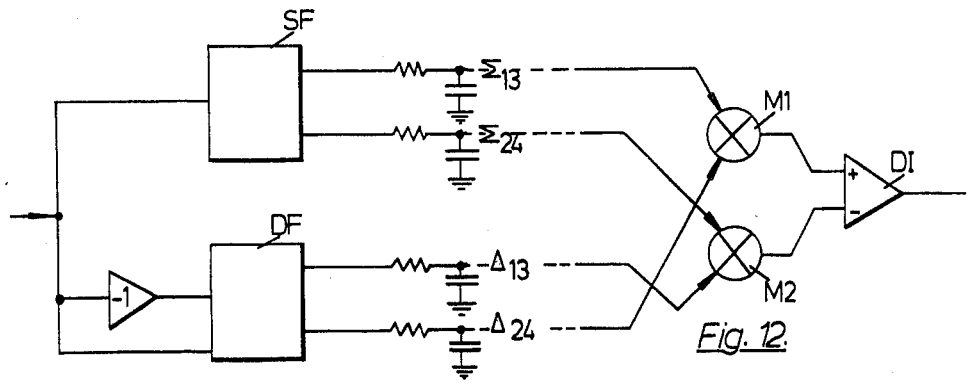
FIG. 12 depicts a product detector for use in the combination of the system described.

Required product or error signal = $\Sigma_{13} \cdot \Delta_{24} - \Sigma_{24} \cdot \Delta_{13}$ A product detector comprising two four-quadrant multipliers M1 and M2 followed by a differential amplifier D1 will perform this function, FIG. 12. The multipliers M1 and M2 derive their inputs from the sum filter SF and the difference filter DF each shown for simplicity as a sampling unit block and charging circuits.

Figure 13:
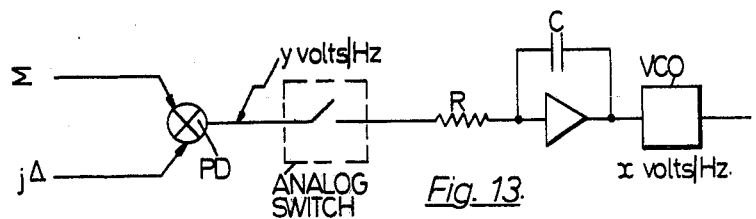
FIG. 13 is a block diagram relating to VCO control in the system described.

The most direct approach for the Doppler ILS application is to use the digital filter as a self-tuned device. The sampling rate is determined by the frequency of a VCO, FIG. 13, which itself is controlled by error signals from the sum and difference outputs, $\Sigma$ and $j\Delta$, of the filter. Error signals are available once per scan period, and should be applied as follows: The error signal is used to charge or discharge a capacitor C in the feedback loop which otherwise retains its charge. The required sensitivity of the charging circuit RC is readily calculated. If the VCO has a linear characteristic of $x$ volts per Hz, the output of the product (error) detector PD is $y$ volts per Hz for $t'$ secs and the active integrator in the loop is R, C, then a frequency error $\delta f$ will cause a charge increment in capacitor C from one error signal of $$\frac{yt'\delta f}{R}.$$

The voltage increment applied to the VCO is therefore $$\delta V = \frac{yt'\delta f}{RC}$$

and if this equals $-x \delta f$, will completely nullify the error $$-x\delta f = \frac{yt'\delta f}{RC}$$

$$y = \frac{-RC}{t'} x.$$

It is not necessary that the sensitivity be exactly equal to this. If it is half this figure, the response will be "overdamped" with a reduction of error by a factor of two every scan period.

If the sensitivity is one and a half times this figure, the response will be underdamped, the error modulus reducing again by a factor of two after every sample. If over twice this figure, instability will set in.

The Doppler beat frequency envelope is to be assumed to be constant in amplitude. A sum and difference pattern produced by tapering the taps of the delay line transversal filter with rectangular weighting distributions yields relatively high sidelobes. A better arrangement (like conventional monopulse) is to have "cosine" weighting for the sum beam and "sine" weighting for the difference beam.

Figure 14:
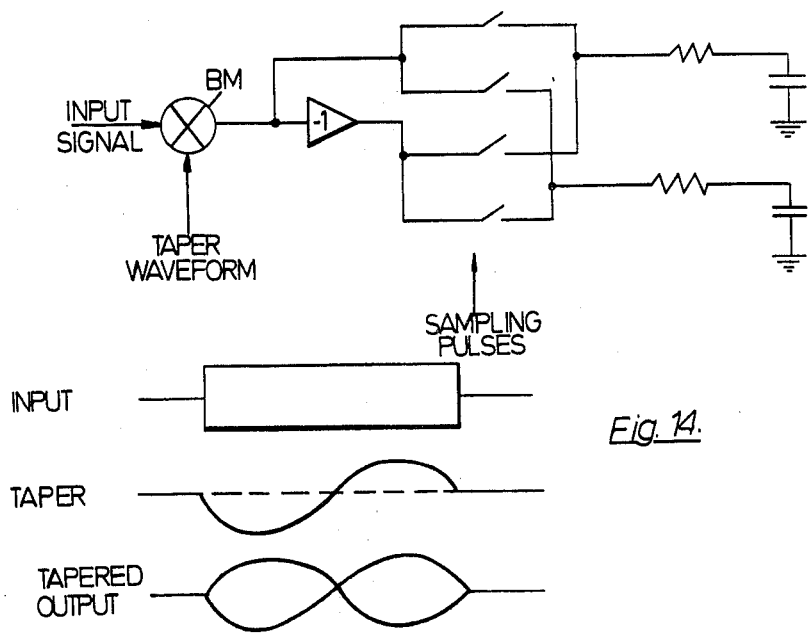
FIG. 14 depicts a circuit and waveforms relating to tapering of the aforementioned input signal waveform.

A convenient method for incorporating effective weighting with the simple digital filter of FIG. 11, involves time-modulating the signal by the desired taper shape in a balanced mixer BM (FIG. 14) or similar device before being channelled to the storage capacitors.

Figure 15:
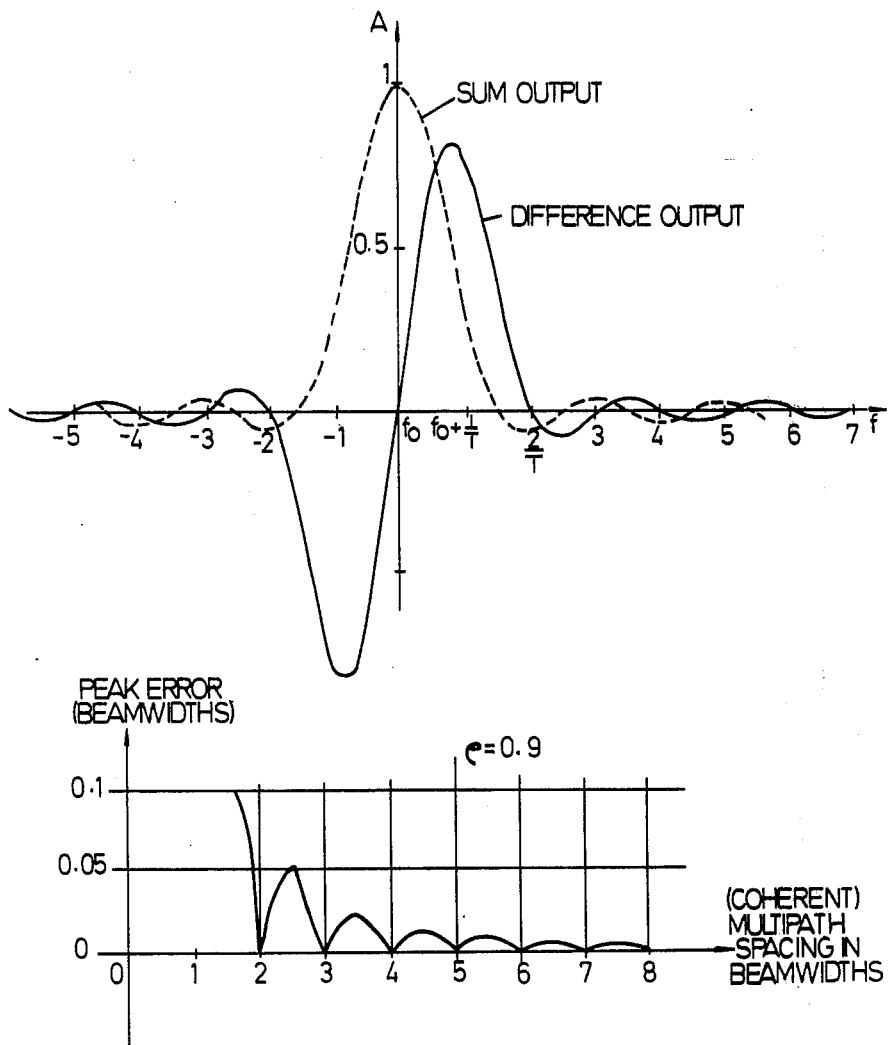
FIG. 15. (a) and (b) illustrate response characteristics resulting from tapering.

For interest, the predicted performance of an effectively tapered filter is shown in FIG. 15(b), together with the steady state response, FIG. 15(a), of the filter for sum and difference outputs.

The tracking arrangement described previously is applicable only when the signal is inside the main beam response of the sum output. A coarse tracking arrangement may be produced as follows. Instead of exact integration of the four sampling signal phases, the samples may be partially integrated by providing a current leak (bypass) across the capacitors. A leakage time constant of $kT_{scan}$ results in a band-pass filter with a bandwidth of approximately $$\frac{1}{\pi k T_{scan}}$$

and this can be made as wide as desired. By utilizing a sum and difference output as before, an error signal, available throughout every scan, can be used to approximately track the signal and then hand over the tracking function to the "fine" loop.

Figure 16:
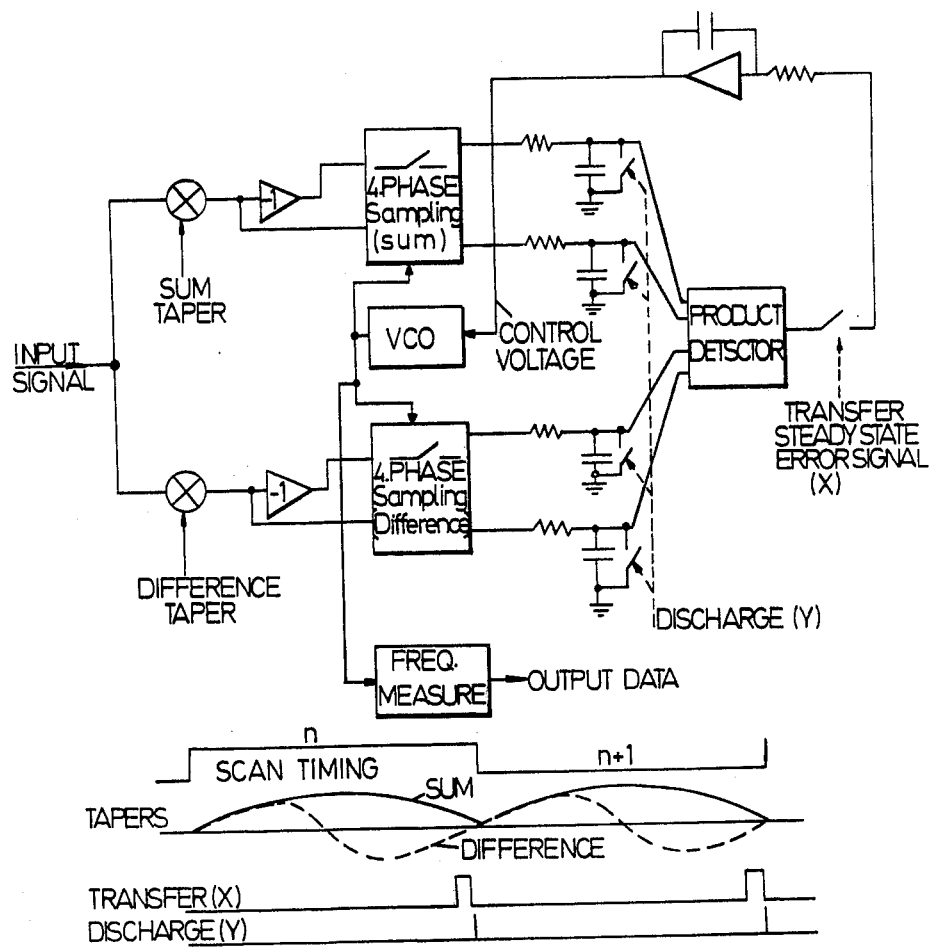
FIG. 16 is a schematic block diagram of a "synchronous" frequency measuring and tracking arrangement.

Two basic types of digital filter configurations applicable to Doppler ILS and Radar have been described. It is worthwhile summarizing their characteristics, as follows:

A. Synchronous filter type — where synchronism is in relation to scan timing (FIG. 16).

These are basically formed by sampling the input signal over each scan period (which may be tapered in phase appropriately within the scan) four times per signal period under control of a VCO, integrating the contributions from the first and third quadrant on a capacitor, and integrating the second and fourth quadrant contributions on another capacitor. At the end of the scan, the steady state response of an equivalent delay line filter is available as the final voltage on the two capacitors. These are then discharged, and another scan signal can be applied to form another steady state value at the scan end. This process is repeated indefinitely in the ILS context, with the steady state signals from a 'sum' and 'difference' filter cross-multiplied together to provide error signals for the VCO which controls the sampling rate. The filters will then track the signal, and a measurement of the VCO frequency will give the indicated bearing for the aircraft (remote station) flight system. This indication will be of a high quality in that suppression of multipath signals will be of a high order.

Figure 17:
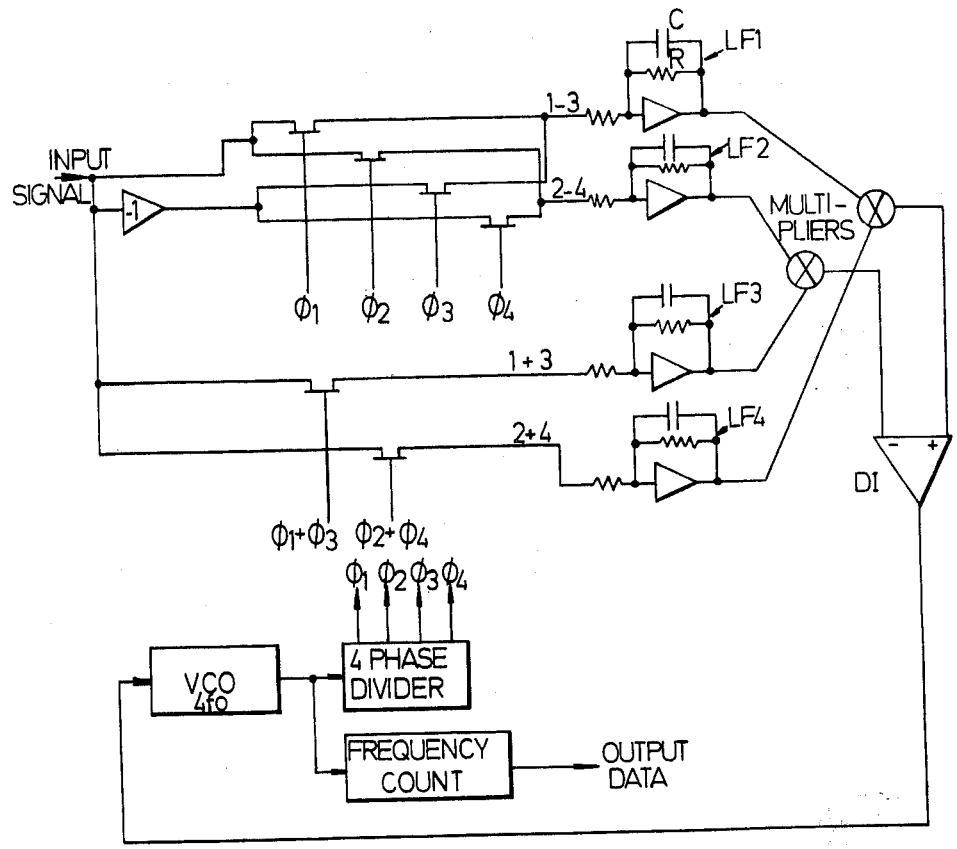
FIG. 17 is a schematic block diagram of an "asynchronous" alternative arrangement for frequency measuring and tracking.

B. Asynchronous filter type (FIG. 17).

This type involves signal sampling as in the synchronous version. The difference is that the storage capacitors are not discharged periodically once per scan but are continuously discharged at a rate suitable to the particular application. No scan timing is therefore required; this implies that tapering of the input signal will be of no value. The output of the two sampling channels can be utilized at all times to provide the signal which makes a VCO track the signal. This is accomplished by producing two filter characteristics and forming a product (or similar) of the two outputs. The first characteristic is obtained by applying $sample_1$ and $(-sample_3)$ to the first "leaky" capacitor (low pass filter LF1), and $sample_2$ and $(-sample_4)$ to the second low pass filter LF2. The second characteristic is obtained by applying $sample_1$ and $sample_3$, (in same polarity) to its first low pass filter LF3. Similarly, $sample_2$ and $sample_4$ (in same polarity) are applied to its second low pass filter LF4. The first characteristic produces a maximum response for a signal frequency equal to a quarter of the sampling rate. The second characteristic produces a null for this signal frequency with a leading or lagging quadrature response (with reference to the first characteristic) for low or high frequencies, respectively.

Further, the low pass filters can be of any order; thus, responses equivalent to high order narrow band filters can be simply obtained.

The signal frequency is measured by measuring the VCO frequency, thus avoiding notching problems. The error signal drive to the VCO may be inhibited during transient periods in the filter responses, however.

Figure 18:
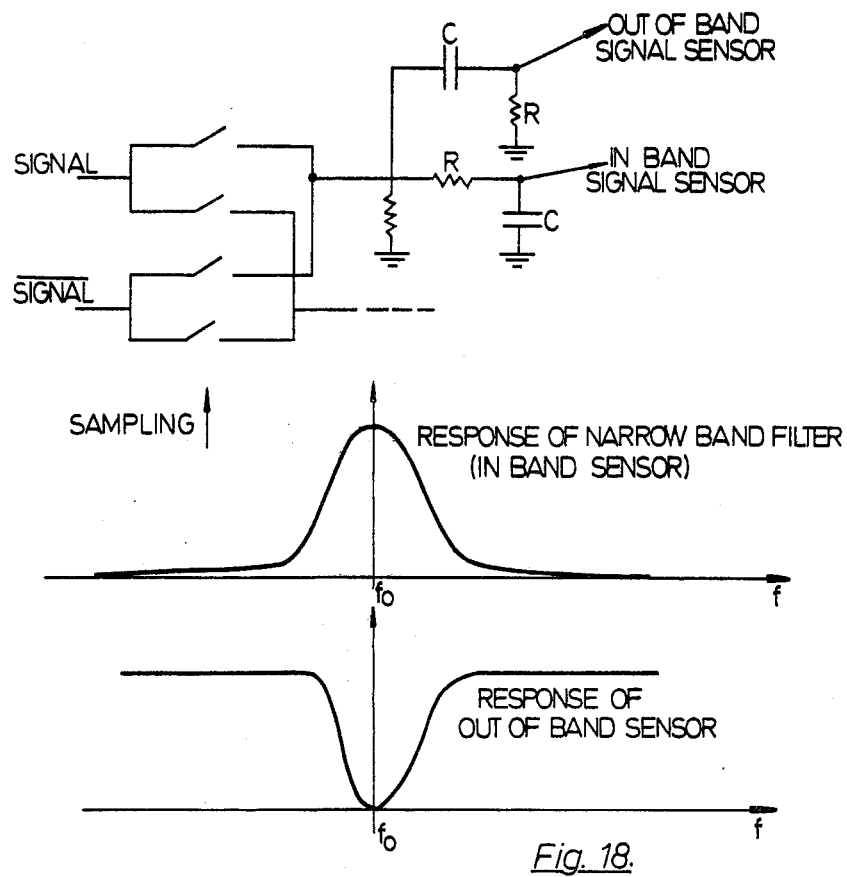
FIG. 18 depicts a "verification" circuit for the combination of the invention.

The asnychronous filter type is made with signal samples in different phases applied to low pass filters. By also applying these samples to high pass filters, a band elimination filter centered at $f_o$ (FIG. 18(a)) can be constructed to effect characteristics as in FIG. 18(b).

Figure 19:
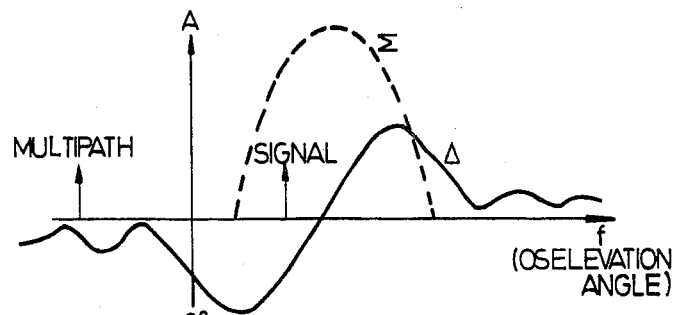
FIG. 19 relates the frequency measuring device of the invention to the radio direction finding application.

For Radar applications, these devices could be used to obtain virtual resolution improvements for separating closely spaced targets as in the context of low angle tracking. In the latter case, for instance, the filter's difference output channel (Δ) could be offset away from ground images to prevent capture by the multipath (see FIG. 19).

What is claimed is:

1. A tracking filter arrangement for measurement of an input signal frequency, comprising:
   a variable frequency oscillator responsive to a control signal to set the frequency of said oscillator;
   sampling means responsive to said oscillator for sampling said input signal at the frequency rate of said oscillator;
   delay means responsive to the output of said sampling means, said delay means providing a plurality of taps substantially equally-spaced by $1/f_o$ and having an overall electrical length corresponding to a plurality of cycles of said input signal, where $f_o$ is a nominal center frequency of response of said tracking filter;
   sum and difference means for generating separate signals representative of the sum and difference of signal amplitudes within first and second groups of contiguous taps;
   product detector means responsive to said separate sum and difference signals to generate an error signal of polarity depending upon whether said oscillator signal is higher or lower than said input signal;
   and means applying said error signal to said oscillator as said control signal in a sense to tend to adjust the frequency of said sampling to match said input signal frequency, whereby measurement of said oscillator frequency is tantamount to measurement of said input signal frequency.

2. Apparatus according to claim 1 in which said first and second groups of contiguous taps are each half of the total number of said taps.

3. Apparatus according to claim 2 in which said sum and difference means includes a difference amplifier having one input thereto connected through an inverter to the signals of said first group of taps, and the second input of said difference amplifier being connected directly to the signals of said second group of taps, the output of said difference amplifier including a 90° phase shifter, and a sum amplifier having one input connected directly to said signals of said first group of taps and the other input directly connected to said signals of said second group of taps, the outputs of said sum amplifier and said difference amplifier through said 90° phase shifter providing the inputs to said product detector means.

4. In a Doppler Navigation system receiver responsive to a ground beacon signal transmission format resulting from commutation to energize the elements of a linear array discretely and sequentially, so as to simulate substantially constant velocity scanning of said array, thereby producing a main bearing signal which undergoes a Doppler frequency shift at said receiver proportional to the sine of the angle subtended by said receiver measured from the normal with respect to the line of said array, apparatus, comprising:
   first means for sampling an input signal waveform derived from said received main bearing signal, over a plurality of cycles of said input signal to form first and second groups of samples;
   second means responsive to said first and second sample groups for deriving corresponding sum and difference signals by addition and subtraction of signal amplitudes of said groups;
   a variable frequency oscillator adapted to provide a frequency set by an applied control signal, the output of said oscillator being also applied to the input of said sampling means to produce a sampling rate;
   and a product detector responsive to said sum and difference signals to produce, and apply to said oscillator, a control signal representative of the sense and magnitude of the difference in frequency between said input and sampling frequencies, the frequency of said oscillator thereby tending to be brought into a predetermined relationship with the frequency of said input signal.

* * * * *